(12) United States Patent
Pozder et al.

(10) Patent No.: US 7,247,552 B2
(45) Date of Patent: Jul. 24, 2007

(54) INTEGRATED CIRCUIT HAVING STRUCTURAL SUPPORT FOR A FLIP-CHIP INTERCONNECT PAD AND METHOD THEREFOR

(75) Inventors: Scott K. Pozder, Austin, TX (US); Kevin J. Hess, Austin, TX (US); Pak K. Leung, Cedar Park, TX (US); Edward O. Travis, Austin, TX (US); Brett P. Wilkerson, Austin, TX (US); David G. Wontor, Austin, TX (US); Jie-Hua Zhao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 319 days.

(21) Appl. No.: 11/033,009

(22) Filed: Jan. 11, 2005

(65) Prior Publication Data

US 2006/0154470 A1    Jul. 13, 2006

(51) Int. Cl.
*H01L 21/4763* (2006.01)
(52) U.S. Cl. .............. 438/618; 257/771; 257/E23.142; 257/E21.575; 257/E21.627
(58) Field of Classification Search .......... 257/771, 257/E23.142, E21.575, E21.627; 438/618
See application file for complete search history.

(56) References Cited

U.S. PATENT DOCUMENTS

| | | | |
|---|---|---|---|
| 5,149,674 A | 9/1992 | Freeman, Jr. et al. |
| 5,514,892 A | 5/1996 | Countryman et al. |
| 5,751,065 A | 5/1998 | Chittipeddi et al. |
| 5,923,088 A | 7/1999 | Shiue et al. |
| 6,144,100 A | 11/2000 | Shen et al. |
| 6,187,658 B1 | 2/2001 | Chittipeddi et al. |
| 6,232,662 B1 | 5/2001 | Saran |
| 6,365,958 B1 | 4/2002 | Ibnabdeljalil et al. |
| 6,384,486 B2 | 5/2002 | Zuniga et al. |
| 6,614,091 B1 | 9/2003 | Downey et al. |
| 2002/0025417 A1 | 2/2002 | Chisholm et al. |
| 2003/0020163 A1 | 1/2003 | Hung et al. |
| 2005/0082577 A1* | 4/2005 | Usui .......................... 257/211 |

OTHER PUBLICATIONS

Wintgens, Carl; "Detailed Structural Analysis I of the Oki Electric Co. Ltd. L67Q4003 32-Bit Microcontroller with Optional Analyses"; Sep. 2004.
U.S. Appl. No. 11/033,008.

* cited by examiner

*Primary Examiner*—Asok Kumar Sarkar
(74) *Attorney, Agent, or Firm*—Robert L. King; James L. Clingan, Jr.

(57) ABSTRACT

A technique for alleviating the problems of defects caused by stress applied to bond pads (32) includes, prior to actually making an integrated circuit (10), adding dummy metal lines (74, 76) to interconnect layers (18, 22, 26) to increase the metal density of the interconnect layers. These problems are more likely when the interlayer dielectrics (16, 20, 24) between the interconnect layers are of a low-k material. A critical area or force area (64) around and under each bond pad defines an area in which a defect may occur due to a contact made to that bond pad. Any interconnect layer in such a critical area that has a metal density below a certain percentage can be the cause of a defect in the interconnect layers. Any interconnect layer that has a metal density below that percentage in the critical area has dummy metal lines added to it.

20 Claims, 2 Drawing Sheets

INTEGRATED CIRCUIT HAVING STRUCTURAL SUPPORT FOR A FLIP-CHIP INTERCONNECT PAD AND METHOD THEREFOR

CROSS REFERENCE TO RELATED APPLICATION

This application is related to copending U.S. patent application Ser. No. 11/033,008 entitled "Method and Apparatus for Providing Structural Support For Interconnect Pad While Allowing Signal Conductance" filed simultaneously herewith by Kevin Hess et al. and assigned to the assignee hereof.

FIELD OF THE INVENTION

This disclosure relates to packaged semiconductors and more particularly to interconnect pads of integrated circuits for making electrical connection to underlying conductive layers.

RELATED ART

The use of conductive balls, such as solder balls, to make electrical connection to a bond pad is a known method to make electrical connection to electrical circuitry of a semiconductor die. Conductive ball packaging is commonly known in the industry as flip chip interconnect. As geometries in semiconductors continue to shrink in size due to improvements in the technology for making semiconductors, the sizes of bond pad regions have become smaller. A smaller bond pad region results in increased stress to the bond pad structure when physical connection is made to the semiconductor die. The bond pad structure includes a metal bond pad and an underlying stack of metal interconnect and dielectric layers. This stack of layers mechanically supports the pad during electrical connection.

Bond pad structures fabricated with copper interconnect metallization and low dielectric constant (low-k) dielectrics are susceptible to mechanical damage during the bonding process. Because the advanced low-k interlayer dielectrics used today have a lower dielectric constant and lower Young's modulus than dielectrics used in earlier generation products, flip chip die attach may more easily mechanically fracture the underlying stack of metal and dielectric layers. Additionally, heat must be applied to the bond pad in order to attach the ball to the package. The heat causes expansion of the die and package substrate. As a result, dielectric cracking and delamination of layers under the flip chip bond pads result from package-to-die Coefficient of Thermal Expansion (CTE) mismatch stresses.

A known method to address the stresses present underlying a bond pad is to use a dedicated support structure. A common structure is the use of at least two metal layers under the bonding pad that are connected together and to the bonding pad by large arrays of vias distributed across a majority of the bond pad area. This via arrangement requires that majority portions of the underlying metal layers and the bonding pad are all electrically connected together and thus are not functionally independent of each other. Therefore, under the bond pad, these majority portions of the underlying two metal layers may not be used for wiring or interconnects unrelated to the pad.

Another known method of mitigating stresses in a bond pad region is to replace low-k dielectric layers with higher k dielectric and higher elastic modulus dielectric layers until the die exhibits resistance to cracking. This method results in increasing the metal line pitch or spacing to obtain acceptable circuit performance. The area required for chip interconnect is therefore notably larger.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally there is herein provided a method and apparatus for providing structural support for interconnect pad locations in an integrated circuit (IC) by using novel layout techniques in the metallization and dielectric stack underlying the pad. As used herein, an interconnect pad, formed of metal, is placed at the surface of an integrated circuit where an electrical connection is made from the pad to one or more underlying interconnect layers. In a typical IC design, multiple interconnect layers separated by interlevel dielectrics are formed in a stack to provide the required interconnections between devices in the semiconductor substrate. Examples of an interconnect pad include, but are not limited to, a wire bond pad, a probe pad, a flip-chip bump pad, a test point or other packaging or test pad structures that may require underlying structural support. The interconnect pad region, located physically underneath the interconnect pad, defines the region in which the layout techniques provided herein may be applied. With these layout techniques, bond pad structures fabricated in IC technologies with copper interconnect metallization and low modulus dielectrics are much less susceptible to mechanical damage during the flip chip process. The use herein of a low modulus material is a material having a value typically less than sixty GPa (GigaPascals). Additionally, the use herein of a low-k material is a material having a relative permittivity or dielectric constant typically less than four. It should be noted that many of the low-k dielectrics in use have low moduli. The use herein of a high modulus material is a material having a value typically equal to or greater than sixty GPa (GigaPascals). Dielectrics having any modulus value may be used in connection with the methods and structures described herein.

Figure 1:
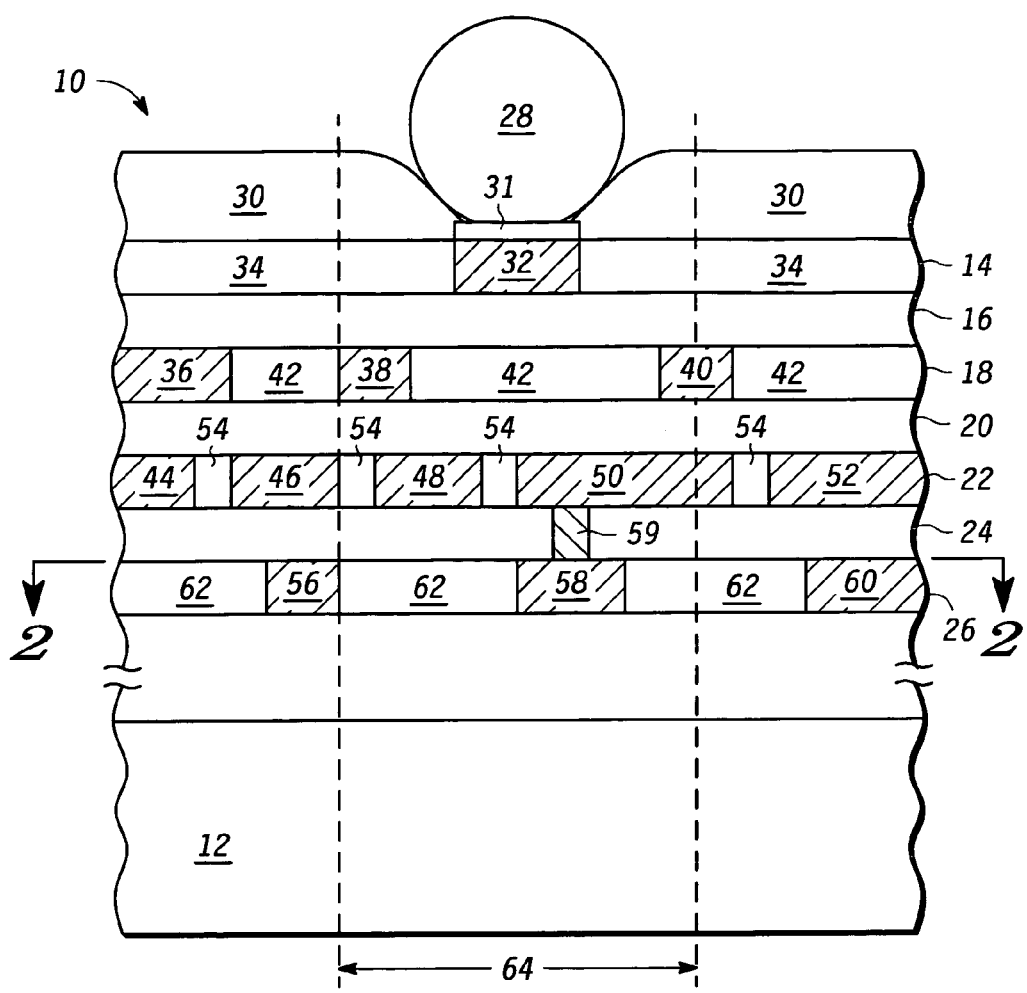
FIG. 1 illustrates in cross-sectional form a portion of an integrated circuit having a bond pad structure underlying a conductive bump.

Illustrated in FIG. 1 is an interconnect structure of an integrated circuit 10 that overlies a substrate 12. The substrate 12 may be formed of any material and is typically a semiconductor such as silicon. Within substrate 12 may be formed one or more semiconductor devices (not shown).

Overlying substrate 12 is a plurality of interconnect layer and interlevel dielectrics (ILDs). For example, a last interconnect or last metal (LM) layer 14 overlies an Nth ILD 16, where N is an integer. The Nth ILD 16 overlies a next-to-last (LM-1) interconnect layer 18. The next-to-last interconnect layer 18 overlies a next to last ILD 20. The next-to-last ILD 20 overlies a second-from-last (LM-2) interconnect layer 22. The second-from-last interconnect layer 22 overlies a second-from-last ILD 24. The second-from-last ILD 24 overlies a third-from-last interconnect layer 26. A conductive bump 28 is positioned overlying and in contact with a metal cap 31. Adjacent the conductive bump 28 and the metal cap is an insulating layer 30 that is used for passivation of the underlying last metal layer 14. In one form the conductive bump 28 is solder but may be other electrically conductive materials, including various metal alloys. In one form the metal cap 31 is aluminum or an alloy thereof and the underlying interconnect layers are copper or an alloy thereof. However, it should be well understood that various metals may be used with the structure described herein. The last metal layer 14 is formed of a conductive bond pad 32 and dielectric 34. It should be well understood that in integrated circuits, there is a plurality of conductive bond pads that are present and which are laterally disposed to conductive bond pad 32 and in other planes not illustrated. In the cross-sectional view of FIG. 1 the metal density or amount of metal present in the last metal layer 14 is significantly less than one hundred percent. Within the next-to-last interconnect layer 18 is a plurality of metal lines, such as metal lines 36, 38 and 40. The metal lines are electrically isolated and separated by a dielectric 42. Within the second-from-last interconnect layer 22 is also a plurality of metal lines, such as metal lines 44, 46, 48, 50 and 52. The metal lines 44, 46, 48, 50 and 52 are electrically isolated and separated by a dielectric 54. Within the third-from-last interconnect layer 26 is a plurality of metal lines, such as metal lines 56, 58 and 60. Metal lines 56, 58 and 60 are electrically isolated and separated by a dielectric 62. The metal line 50 of the second-from-last interconnect layer 22 is electrically connected to the metal line 58 of the third-from-last interconnect layer 26 by a via 59 that intersects dielectric 24. Thus electrical connection exists between a portion of the second-from-last interconnect layer 22 and the third-from-last interconnect layer 26. A force region 64 is illustrated spanning the interconnect pad region directly underlying the conductive bump 28 and extending laterally a limited distance. In one form the distance is substantially one hundred fifty thousand nanometers (150 microns) from the center of the bond pad 32. The force region 64 is a region within the integrated circuit 10 in which forces are exerted on the interconnect structure when a die attach is performed to the conductive bump 28. The area of the force region 64 may vary depending upon device technology and geometries.

Figure 2:
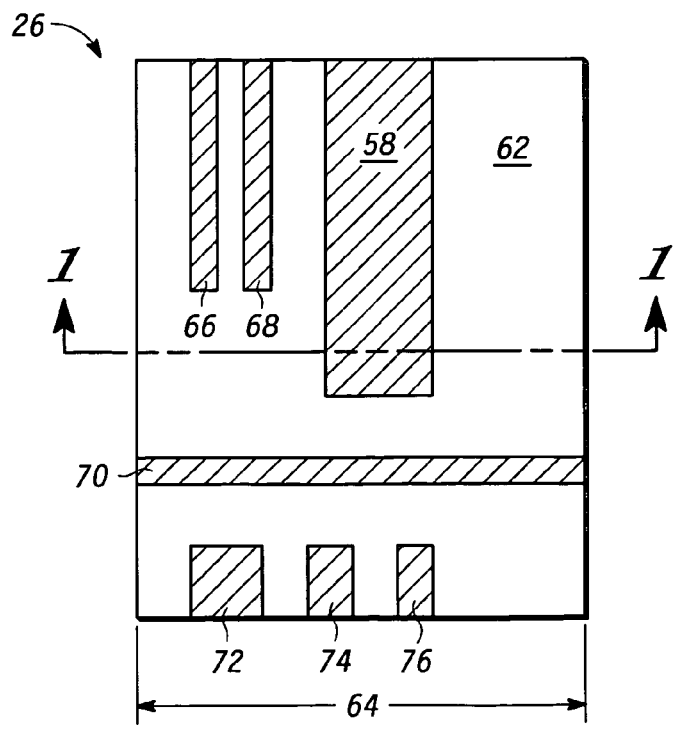
FIG. 2 illustrates a top plan view of a portion of one conductive layer of the bond pad structure of FIG. 1 taken substantially along line 2-2.

Illustrated in FIG. 2 is a top plan view of the interconnect of integrated circuit 10 within the force region 64 and taken along line 2-2 of FIG. 1 which is the uppermost surface of the third-from-last interconnect layer 26. As illustrated in FIG. 2, a significant portion of the third-from-last interconnect layer 26 includes dielectric 62. Within dielectric 62 is metal line 58 that was visible in the FIG. 1 view as well as additional metal lines such as metal line 66, metal line 68, metal line 70, metal line 72, metal line 74 and metal line 76.

We have discovered that in order to adequately support the overlying conductive bump 28, a predetermined minimum amount of metal or a minimum metal density must exist within each conductive layer of metal. When this predetermined minimum metal density is satisfied, each interconnect layer may be mechanically functionally independent and no vias are required to be connected for structural support. This feature is significant as it permits each of the interconnect layers underlying conductive bump 28 to be functionally independent in the circuit if desired and mechanically supportive in the interconnect stack. As a result, a significant amount of space on an integrated circuit is saved as compared with prior interconnects which required connected underlying nonfunctioning interconnect layers for support.

To ensure adequate support, the layout of each interconnect layer is required to have a minimum amount of metal which is referred to herein as metal density. The minimum or predetermined amount is a percentage that will vary depending upon the dielectric materials used and the particular metal used to implement the metal lines. For example, in one embodiment the predetermined minimum metal density is forty percent. In another embodiment the predetermined metal density is fifty-five percent. Generally, a range for the minimum metal density is from thirty-five percent to eighty percent, but it should be appreciated that values other than those within this range may adequately provide structural support depending upon the materials used and the layout of the metal lines. Within the third-from-last interconnect layer 26 of FIG. 2 are metal lines additional to those that are visible in the single plane of the cross-sectional view of FIG. 1. For example, metal lines 66, 68, 70, 72, 74 and 76 exist within the third-from-last interconnect layer 26. Assume for purposes of explanation only that the metal area of the metal lines 58, 66, 68, 72, 74 and 76 within the force region 64 as compared with the total area of the third-from-last interconnect layer 26 within the force region 64 is less than a desired predetermined minimum.

Figure 3:
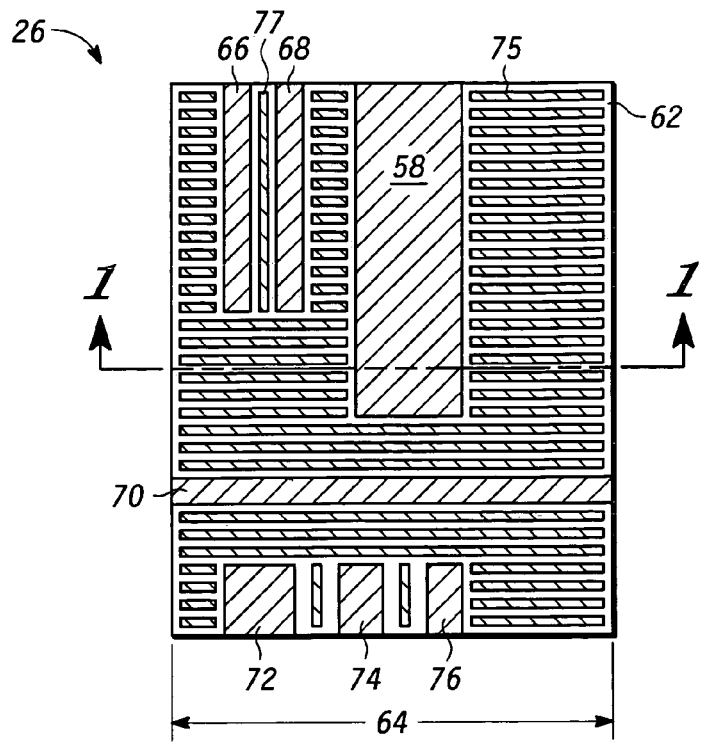
FIG. 3 illustrates a top plan view of the conductive layer of FIG. 2 after increasing metal density of the conductive layer.

Illustrated in FIG. 3 is a resulting modification of the third-from-last interconnect layer 26 to increase the metal density. A plurality of dummy lines, such as dummy line 75 and dummy line 77 and others that are not numbered, is added to the surface area of the third-from-last interconnect layer 26 such that optimally at least the minimum metal density is reached. However, in some cases the design and design rules will only permit the metal density to be increased from an initial amount to an amount that does not reach the predetermined minimum metal density. In these limited cases the increased metal density, by adding dummy lines such as dummy line 75 and dummy line 77, will typically be sufficient to provide adequate interconnect support when the method is applied across an entire integrated circuit design. Additionally, within a single interconnect, only one or a few interconnect layers may not have the predetermined minimum metal density. Because a large percentage of the other layers and interconnects do meet the metal density minimum, adequate support is provided and the integrated circuit die is robust.

In the illustrated form of FIG. 3, the open surface area of dielectric 62 is filled with dummy lines consistent with the layout rules and determined by the existing design features. It should be noted that the dummy lines are added, in the illustrated form, in one of two orientations, such as in an X direction and an orthogonal Y direction. This is because most commercially available place and route tools function to place features in only one of two orientations and the orientations are typically orthogonal. However, for purposes of providing the required support, it should be well understood that any orientation and direction of dummy line placement, consistent with required design layout rules, will accomplish the desired objective.

Figure 4:
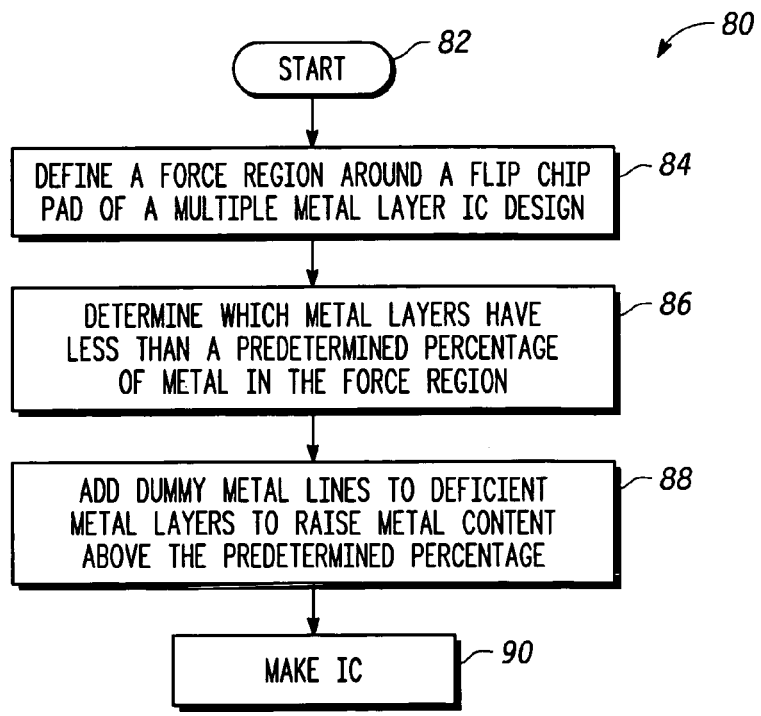
FIG. 4 illustrates in flow chart form a method for providing structural support of a flip chip interconnect pad.

Illustrated in FIG. 4 is a method 80 of providing structural support for a flip chip interconnect pad. After a start step 82, in a step 84 a force region is defined around a flip chip pad of a multiple interconnect layer integrated circuit design. The force region can be determined by conventional stress analysis and fracture mechanics simulation using commercially available computer-aided-design tools. A force region is therefore defined for each flip chip pad. The method described herein may therefore be repeated for each flip chip pad in a design or each of these steps may be performed in parallel for all identified flip chip pads. In a step 86 a determination is made which interconnect layers have less than a predetermined percentage of metal in the force region. In a step 88, dummy metal lines are added to deficient interconnect layers in which the predetermined percentage of metal does not exist in the force region. The additional metal lines raise the metal content in the interconnect layers where the dummy metal lines are added. In the majority of interconnect layers the metal content is raised above the predetermined percentage. In a step 90 an integrated circuit is made or fabricated as the design has been created using a method that ensures adequate structural support for flip chip bond pads.

By now it should be appreciated that there has been provided an interconnect pad structure and method for providing structural support for a flip chip bond pad. By providing underlying interconnect layers that have a minimum metal density, the intervening dielectric is toughened to provide significantly increased support. As a result, desirable low-k dielectrics, and dielectrics with lower hardness and lower modulus may be used. Much of the flip chip bond pad stress results from a shear force. The stress is minimized in crack-prone areas (i.e. dielectric spaces and isolated metal lines) and the shear force is more uniformly distributed over the entire force region 64 using the minimum metal density method described herein. The underlying additional metal added to each interconnect layer when the metal density is not above a minimum percentage of the area of the interconnect layer functions to more uniformly redistribute the stress from the flip chip bump during die attach with minimal interference of circuit layout. The design methodology disclosed herein allows wiring under an integrated circuit pad, allows vias to be placed by circuit design, and allows stacked orthogonal and parallel metal traces that can be replaced by circuit metal as needed. The metal dummy lines described herein are uniform with a minimum number of corners under a bond pad. Uniform distribution of metal is also accomplished by forming the metal at a smallest metal sizing and spacing permitted by design and processing constraints.

In one form there has been provided an integrated circuit having a substrate with active circuitry. A bond pad is provided over the substrate. A force region is identified around and under the bond pad characterized by being susceptible to defects due to contacts to the bond pad. A stack of interconnect layers is provided, wherein each interconnect layer has a portion in the force region. A plurality of interlayer dielectrics separate the interconnect layers of the stack of interconnect layers and have vias for interconnecting the interconnect layers of the stack of interconnect layers. At least one interconnect layer of the stack of interconnect layers comprises functional metal lines and dummy metal lines in the portion that is in the force region to obtain a predetermined metal density in the portion that is in the force region. In one form the integrated circuit further comprise a conductive ball on the bond pad. In another form the dummy lines run in two directions that are orthogonal to each other. In yet another form each of the functional lines is one of a signal line or a power line. In one form the predetermined metal density is less than forty percent.

In another form there is provided a method of making an integrated circuit. A circuit design having a layout is provided and comprises a substrate having active circuitry. A stack of interconnect layers is provided for interconnecting the active circuitry. A plurality of interlayer dielectrics insulates the interconnect layers of the stack of interconnect layers. The interconnect layers of the stack of interconnect layers are connected with vias. A bond pad is provided. A force region under and around the bond pad is defined. A determination is made which interconnect layers of the stack of interconnect layers have a metal density that is a less than a predetermined percentage. A modified design is obtained by adding dummy metal lines to the interconnect layers of the stack of interconnect layers that were determined to have less than the predetermined percentage sufficient to raise the metal density to at least the predetermined percentage. The integrated circuit is then made according to the modified design. In one form the predetermined percentage is not greater than forty per cent. In another form the predetermined percentage is not greater than fifty-five percent. In another form the force region is a region in which the interconnect layers of the stack of interconnect layers are susceptible to stress from the bond pad due to assembly or other processes. In another form the interconnect layers of the stack of interconnect layers comprise copper and the plurality of interlayer dielectrics are characterized as comprising dielectric layers having a relative permittivity less than four.

There is also provided a method of making an integrated circuit having a plurality of bond pads. A circuit design of the integrated circuit is developed. A layout of the integrated circuit is developed according to the circuit design, wherein the layout comprises a plurality of interconnect layers. A force region is defined around and under a first bond pad of the plurality of bond pads, wherein the force region comprises a first portion of each of the plurality of interconnect layers. A first interconnect layer of the plurality of interconnect layers is identified in which the first portion of the first interconnect layer has a metal density below a predetermined percentage. The layout is modified by adding dummy metal lines to the first portion of the first interconnect layer to increase the metal density of the first portion of the first interconnect layer. The integrated circuit is made comprising the dummy metal lines. In one form the interconnect layers comprise copper. In another form the layout comprises low-k dielectric layers separating the plurality of interconnect layers, wherein the low-k dielectric layers have vias for interconnecting the interconnect layers. In another form conductive balls are formed on the bond pads. In another form the plurality of interconnect layers comprise copper. In yet another form the predetermined percentage is not greater than fifty-five percent. In yet another form the predetermined percentage is not greater than forty percent. In yet another form the dummy lines run in one of two directions in which the two directions are orthogonal to each other. In one form the first portion of the first interconnect layer comprises functional metal lines.

There is also provided a method of making an integrated circuit having a plurality of bond pads. A circuit design of the integrated circuit is developed. A layout of the integrated circuit is developed according to the circuit design, wherein the layout comprises a plurality of interconnect layers that extend under the plurality of bond pads. The layout is modified by adding dummy metal lines to the plurality of interconnect layers to achieve a metal density of at least forty percent for each metal line of the plurality of interconnect layers. The integrated circuit is made comprising the dummy metal lines.

In the foregoing specification, the invention has been described with reference to specific embodiments. However, one of ordinary skill in the art appreciates that various modifications and changes can be made without departing from the scope of the present invention as set forth in the claims below. For example, although in the form illustrated dummy lines are added when the predetermined minimum is not met in such a way as to fill in all empty layout areas consistent with design rules criteria, a lesser amount of dummy metal may be added. Therefore, various amounts of dummy metal may be added to any one interconnect layer and the various interconnect layers may contain differing amounts of dummy metal. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term "another", as used herein, is defined as at least a second or more. The terms "including" and/or "having", as used herein, are defined as "comprising" (i.e., open language). The term "coupled", as used herein, is defined as connected, although not necessarily directly, and not necessarily mechanically.

What is claimed is:

1. An integrated circuit, comprising:
   a substrate having active circuitry;
   a bond pad over the substrate;
   a force region at least under the bond pad characterized by being susceptible to defects due stress applied to the bond pad;
   a stack of interconnect layers, wherein each interconnect layer has a portion in the force region; and
   a plurality of interlayer dielectrics separating the interconnect layers of the stack of interconnect layers and having at least one via for interconnecting two of the interconnect layers of the stack of interconnect layers;
   wherein at least one interconnect layer of the stack of interconnect layers comprises a functional metal line underlying the bond pad that is not electrically connected to the bond pad and is used for wiring or interconnect to the active circuitry, the at least one interconnect layer of the stack of interconnect layers further comprising dummy metal lines in the portion that is in the force region to obtain a predetermined metal density in the portion that is in the force region.

2. The integrated circuit of claim 1, further comprising a conductive ball on the bond pad.

3. The integrated circuit of claim 1, wherein the dummy metal lines run in two directions orthogonal to each other.

4. The integrated circuit of claim 1, wherein each of the functional metal lines is one of a signal line or a power line.

5. The integrated circuit of claim 1, wherein the predetermined metal density is less than forty per cent.

6. A method of making an integrated circuit, comprising:
   providing a circuit design having a layout comprising:
      a substrate having active circuitry;
      a stack of interconnect layers for interconnecting the active circuitry;
      a plurality of interlayer dielectrics for insulating the interconnect layers of the stack of interconnect layers and for connecting the interconnect layers of the stack of interconnect layers with vias;
      a bond pad overlying the stack of interconnect layers and the plurality of interlayer dielectrics, at least one underlying interconnect layer of the stack of interconnect layers not being electrically connected to the bond pad and being used for wiring or interconnect other than directly to the bond pad;
   defining a force region at least under the bond pad;
   determining which interconnect layers of the stack of interconnect layers have a metal density that is a less than a predetermined percentage;
   obtaining a modified design by adding dummy metal lines to the interconnect layers of the stack of interconnect layers that were determined to have less than the predetermined percentage sufficient to raise the metal density to at least the predetermined percentage; and
   making the integrated circuit according to the modified design.

7. The method of claim 6, wherein the predetermined percentage is not greater than forty per cent.

8. The method of claim 6, wherein the predetermined percentage is not greater than fifty-five per cent.

9. The method of claim 6, wherein the force region is a region in which the interconnect layers of the stack of interconnect layers are susceptible to stress from the bond pad due to assembly or other processes.

10. The method of claim 6, wherein the interconnect layers of the stack of interconnect layers comprise copper and the plurality of interlayer dielectrics are characterized as comprising dielectric layers having a relative permittivity less than four.

11. A method of making an integrated circuit having a plurality of bond pads, comprising:
   developing a circuit design of the integrated circuit;
   developing a layout of the integrated circuit according to the circuit design, wherein the layout comprises a plurality of interconnect layers underlying a first bond pad of the plurality of bond pads, at least one of the plurality of interconnect layers not being electrically connected to the first bond pad and used for wiring or interconnect other than directly to the first bond pad;
   defining a force region at least under the first bond pad of the plurality of bond pads, wherein the force region comprises a first portion of each of the plurality of interconnect layers;
   identifying a first interconnect layer of the plurality of interconnect layers in which the first portion of the first interconnect layer has a metal density below a predetermined percentage;
   modifying the layout by adding dummy metal lines to the first portion of the first interconnect layer to increase the metal density of the first portion of the first interconnect layer; and making the integrated circuit comprising the dummy metal lines.

12. The method of claim 11, wherein each of the plurality of interconnect layers comprises copper.

13. The method of claim 11, wherein the layout comprises low-k dielectric layers separating the plurality of interconnect layers, wherein the low-k dielectric layers have vias for interconnecting the plurality of interconnect layers.

14. The method of claim 11, wherein the making the integrated circuit further comprises forming conductive balls on the plurality of bond pads.

15. The method of claim 11, wherein the plurality of interconnect layers comprise copper.

16. The method of claim 11, wherein the predetermined percentage is not greater than fifty-five per cent.

17. The method of claim 11, wherein the predetermined percentage is not greater than forty per cent.

18. The method of claim 11, wherein the dummy metal lines run in one of two directions in which the two directions are orthogonal to each other.

19. The method of claim 11, wherein the first portion of the first interconnect layer comprises one of a signal line or a power line.

20. A method of making an integrated circuit having a plurality of bond pads, comprising:

developing a circuit design of the integrated circuit;

developing a layout of the integrated circuit according to the circuit design, wherein the layout comprises a plurality of metal-containing interconnect layers that extend under a first bond pad of the plurality of bond pads, at least a portion of the plurality of metal-containing interconnect layers underlying the first bond pad and not electrically connected to the first bond pad as a result of being used for electrical interconnection not directly connected to the bond pad;

modifying the layout by adding dummy metal lines to the plurality of metal-containing interconnect layers to achieve a metal density of at least forty percent for each of the plurality of metal-containing interconnect layers; and forming the integrated circuit comprising the dummy metal lines.

* * * * *

UNITED STATES PATENT AND TRADEMARK OFFICE
CERTIFICATE OF CORRECTION

PATENT NO. : 7,247,552 B2 Page 1 of 1
APPLICATION NO. : 11/033009
DATED : January 11, 2005
INVENTOR(S) : Scott K. Pozder It is certified that error appears in the above-identified patent and that said Letters Patent is hereby corrected as shown below:

In Column 7, Line 49, Claim No. 1:

Change "defects due stress" to -- defects due to stress --

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,247,552 B2  Page 1 of 1
APPLICATION NO. : 11/033009
DATED : July 24, 2007
INVENTOR(S) : Scott K. Pozder It is certified that error appears in the above-identified patent and that said Letters Patent is hereby corrected as shown below:

In Column 7, Line 49, Claim No. 1:

Change "defects due stress" to -- defects due to stress --

This certificate supersedes the Certificate of Correction issued May 20, 2008.

Signed and Sealed this

Seventeenth Day of June, 2008

JON W. DUDAS
*Director of the United States Patent and Trademark Office*